US012148856B2

(12) United States Patent
Chai et al.

(10) Patent No.: US 12,148,856 B2
(45) Date of Patent: Nov. 19, 2024

(54) SOLAR CELL, METHOD FOR MANUFACTURING THE SAME, AND PHOTOVOLTAIC MODULE (71) Applicants: SHANGHAI JINKO GREEN ENERGY ENTERPRISE MANAGEMENT CO., LTD., Shanghai (CN); ZHEJIANG JINKO SOLAR CO., LTD., Zhejiang (CN)

(72) Inventors: Jialei Chai, Zhejiang (CN); Ding Yu, Zhejiang (CN); Shijie Zhao, Zhejiang (CN); Xiaowen Zhang, Zhejiang (CN); Wenqi Li, Zhejiang (CN); Jie Yang, Zhejiang (CN); Xinyu Zhang, Zhejiang (CN); Hao Jin, Zhejiang (CN)

(73) Assignees: Shanghai Jinko Green Energy Enterprise Management Co., Ltd., Shanghai (CN); Zhejiang Jinko Solar Co., Ltd., Haining (CN)

( * ) Notice: Subject to any disclaimer, the term of this patent is extended or adjusted under 35 U.S.C. 154(b) by 74 days.

(21) Appl. No.: 17/492,604

(22) Filed: Oct. 2, 2021

(65) Prior Publication Data
US 2023/0071754 A1 Mar. 9, 2023

(30) Foreign Application Priority Data
Sep. 6, 2021 (CN) .......................... 202111040162.4

(51) Int. Cl.
H01L 31/0216 (2014.01)
H01L 21/02 (2006.01)
H01L 31/18 (2006.01)

(52) U.S. Cl.
CPC ...... H01L 31/1868 (2013.01); H01L 21/0214 (2013.01); H01L 31/02167 (2013.01)

(58) Field of Classification Search
CPC .......... H01L 21/0214; H01L 21/02164; H01L 21/02123; H01L 21/02178; H01L 31/02167; H01L 31/02168
See application file for complete search history.

(56) References Cited

U.S. PATENT DOCUMENTS 9,978,902 B2    5/2018   Zhu et al.
10,991,838 B1   4/2021   Yang et al.
(Continued)

FOREIGN PATENT DOCUMENTS

CN    104900722 A    9/2015
CN    107845692 A  * 3/2018  ......... H01L 31/0224
(Continued)

OTHER PUBLICATIONS

English machine translation for Yang et al. (KR 2014-0114537) published Sep. 29, 2014.*
(Continued)

Primary Examiner — Christina Chern
(74) Attorney, Agent, or Firm — USCH Law, PC (57) ABSTRACT A solar cell, a manufacturing method therefor, and a photovoltaic module are provided. The solar cell includes a substrate having a front surface and a rear surface, a passivation stack disposed on the front surface, and a tunneling oxide layer and a doped conductive layer disposed on the rear surface. The passivation stack includes an oxygen-containing dielectric layer, a first passivation layer and a second passivation layer. The first passivation layer includes a first interface adjacent to the oxygen-containing dielectric layer and a second interface adjacent to the second passivation layer, the second passivation layer includes a third interface opposite to the second interface, a nitrogen content and a silicon content at the second interface are higher than those at the first interface and the third interface, respectively, and an oxygen content at the second interface is lower
(Continued)

than that at the first interface and the third interface, respectively.

12 Claims, 5 Drawing Sheets

(56) References Cited

U.S. PATENT DOCUMENTS

| | | | |
|---|---|---|---|
| 2010/0059114 A1 | 3/2010 | Park et al. | |
| 2014/0170800 A1* | 6/2014 | Loscutoff | H01L 31/182 438/98 |
| 2015/0132551 A1 | 5/2015 | Cao et al. | |
| 2018/0204962 A1 | 7/2018 | Choi et al. | |
| 2019/0371950 A1* | 12/2019 | Damiani | H01L 31/0201 |
| 2021/0217907 A1 | 7/2021 | Chen et al. | |

FOREIGN PATENT DOCUMENTS

| | | | | |
|---|---|---|---|---|
| CN | 109244149 A | * | 1/2019 | ....... H01L 31/02167 |
| CN | 109728104 A | | 5/2019 | |
| CN | 209471975 U | | 10/2019 | |
| CN | 112164728 A | | 1/2021 | |
| CN | 112201700 A | | 1/2021 | |
| CN | 112201701 A | | 1/2021 | |
| CN | 112310232 A | | 2/2021 | |
| CN | 213071156 U | | 4/2021 | |
| EP | 2290704 A1 | | 3/2011 | |
| EP | 3246954 A1 | | 11/2017 | |
| EP | 3072165 B1 | | 7/2020 | |
| EP | 3783668 A1 | | 2/2021 | |
| JP | 5019397 B2 | | 9/2012 | |
| JP | 2013508998 A | | 3/2013 | |
| JP | 2015122435 A | | 7/2015 | |
| JP | 2017126750 A | * | 7/2017 | ....... H01L 31/02167 |
| KR | 20140114537 A | * | 9/2014 | ........... H01L 31/042 |
| WO | 2019242761 A1 | | 12/2019 | |

OTHER PUBLICATIONS

English machine translation for Lee et al. (JP 2017-126750) published Jul. 20, 2017.*
English machine translation for Wang et al. (CN 107845692) published Mar. 27, 2018.*
English machine translation for Zhu et al. (CN 109244149) published Jan. 18, 2019.*
English machine translation for Zhang et al. (CN 104900722) published Sep. 9, 2015.*
Refractive index for silicon nitride retrieved from https://refractiveindex.info/?shelf=main&book=Si3N4&page=Philipp on Mar. 20, 2024.*
Refractive index for aluminum oxide retrieved from https://refractiveindex.info/?shelf=main&book=Al2O3&page=Malitson-o on Mar. 20, 2024.*
Shanghai Jinko Green Energy Enterprise Management Co., Ltd. et al., Extended European Search Report, EP21199752.3, Mar. 17, 2022, 7 pgs.
Ma S et al., Application of SiOxNy films in industrial bifacial PERC solar cells, Solar Energy Materials and Solar Cells, Elsevier Science Publishers, Amsterdam, NL, vol. 230, May 31, 2021, 9 pgs.
Keding R et al., Silicon doping performed at different diffusion sources aiming co-diffusion, Proceedings/EU PVSEC 2012, 27th European Photovoltaic Solar Energy Conference and Exhibition: Messe Frankfurt and and Congress Center, Frankfurt, Germany, Conference Sep. 24-28, 2012, Exhibition Sep. 25-28, 2012, Munchen:WIP Renewablee, Oct. 31, 2012, 6 pgs.
Soman A. et al., Broad range refractive index engineering of SixNy and SiOxNy thin films and exploring their potential applications in crystalline silicon solar cells, Materials Chemistry and Physics, vol. 197, Aug. 15, 2017, 11 pgs.
Dupuis J. et al., Impact of PECVD SiON stoichiometry and post-annealing on the silicon surface passivation, Thin Solid Films vol. 516, No. 20, Aug. 30, 2008, 12 pgs.
Shanghai Jinko Green Energy Enterprise Management Co., Ltd et al., AU First Office Action, AU 2021240193, Sep. 29, 2022, 7 pgs.

* cited by examiner

SOLAR CELL, METHOD FOR MANUFACTURING THE SAME, AND PHOTOVOLTAIC MODULE

CROSS-REFERENCE TO RELATED APPLICATION

The application claims priority to Chinese Patent Application No. 202111040162.4, filed on Sep. 6, 2021, the content of which is incorporated herein by reference in its entirety.

TECHNICAL FIELD

Embodiments of the present disclosure relate to the photovoltaic field, in particular to a solar cell, a method for manufacturing the solar cell, and a photovoltaic module.

BACKGROUND

With development of solar cell technology, the efficiency of sunlight absorption becomes one of the important factors which effects further improvement of solar cell in conversion efficiency. The light absorption efficiency of the solar cell is related to the parameters of the passivation structure, which include, but are not limited to, laminated structure, composition of the layer, trend of the related element content in each layer, and thickness of the layer. Therefore, optimization of the parameters of the passivation structure is the key to improve the solar cell in conversion efficiency.

SUMMARY

In an aspect, embodiments of the present disclosure provide a solar cell including a substrate, a passivation stack, a tunneling oxide layer and a doped conductive layer. The substrate has a front surface and a rear surface opposite to each other. The passivation stack is disposed on the front surface. The passivation stack includes an oxygen-containing dielectric layer, a first passivation layer, and a second passivation layer that are sequentially disposed in a direction away from the front surface, the oxygen-containing dielectric layer includes a metal oxide material, the first passivation layer includes a silicon nitride material, and the second passivation layer includes a silicon oxynitride material. The tunneling oxide layer and the doped conductive layer that are sequentially disposed on the rear surface in a direction away from the rear surface. The doped conductive layer and the substrate have doping elements of a same conductivity type. The first passivation layer includes a first interface adjacent to the oxygen-containing dielectric layer and a second interface adjacent to the second passivation layer, the second passivation layer includes a third interface opposite to the second interface. A nitrogen content at the second interface is higher than that at the first interface and the third interface, respectively. A silicon content at the second interface is higher than that at the first interface and the third interface, respectively. An oxygen content at the second interface is lower than that at the first interface and the third interface, respectively.

In an embodiment, in a direction away from the front surface, a nitrogen content and a silicon content in the first passivation layer increase at first and then decrease, a nitrogen content and a silicon content in the second passivation layer decrease, an oxygen content in the first passivation layer decreases at first and then increases, and an oxygen content in the second passivation layer increases.

In an embodiment, in a direction away from the front surface, a distance from a position where an oxygen content reaches a maximum peak value in the passivation stack to a position where the oxygen content reaches a secondary peak value in the passivation stack is in a range of 40 nm to 100 nm, a distance from a position where a silicon content reaches a maximum peak value in the passivation stack to the front surface is greater than 0 nm and less than or equal to 30 nm, and a distance from a position where a nitrogen content reaches a maximum peak value in the passivation stack to the front surface is greater than or equal to 30 nm.

In an embodiment, the metal oxide material includes at least one of aluminum oxide, gallium oxide, titanium oxide, or hafnium oxide.

In an embodiment, an atomic fraction of oxygen in the oxygen-containing dielectric layer is in a range of 15% to 50%.

In an embodiment, the first passivation layer includes at least two passivation sub-layers, and in a direction away from the front surface, the passivation sub-layers gradually decrease in atomic fraction of silicon and gradually increase in atomic fraction of nitrogen.

In an embodiment, the first passivation layer includes a bottom passivation sub-layer closest to the front surface and a top passivation sub-layer furthest from the front surface. In the bottom passivation sub-layer, an atomic fraction of silicon is in a range of 60% to 70%, and an atomic fraction of nitrogen is in a range of 20% to 40%. In the top passivation sub-layer 142, an atomic fraction of silicon is in a range of 45% to 60%, and an atomic fraction of nitrogen is in a range of 30% to 50%.

In an embodiment, in the second passivation layer, an atomic fraction of silicon is in a range of 30% to 60%, an atomic fraction of oxygen is in a range of 3% to 50%, and an atomic fraction of nitrogen is in a range of 5% to 50%.

In an embodiment, a thickness of the oxygen-containing dielectric layer is in a range of 1 nm to 15 nm in a direction perpendicular to the front surface.

In an embodiment, a thickness of the first passivation layer is in a range of 30 nm to 60 nm in a direction perpendicular to the front surface.

In an embodiment, a thickness of the second passivation layer is in a range of 20 nm to 40 nm in a direction perpendicular to the front surface.

In another aspect, embodiments of the present disclosure provide a photovoltaic module including a cell string, a package adhesive film and a cover plate. The cell string includes a plurality of solar cells connected with each other. The package adhesive film is configured to cover a surface of the cell string. The cover plate is configured to cover a surface of the package adhesive film facing away from the cell string. The solar cell includes a substrate, a passivation stack, a tunneling oxide layer and a doped conductive layer. The substrate has a front surface and a rear surface opposite to each other. The passivation stack is disposed on the front surface. The passivation stack includes an oxygen-containing dielectric layer, a first passivation layer, and a second passivation layer that are sequentially disposed in a direction away from the front surface, the oxygen-containing dielectric layer includes a metal oxide material, the first passivation layer includes a silicon nitride material, and the second passivation layer includes a silicon oxynitride material. The tunneling oxide layer and the doped conductive layer that are sequentially disposed on the rear surface in a direction away from the rear surface. The doped conductive layer and the substrate have doping elements of a same conductivity type. The first passivation layer includes a first interface adjacent to the oxygen-containing dielectric layer and a second interface adjacent to the second passivation layer, the second passivation layer includes a third interface opposite to the second interface. A nitrogen content at the second interface is higher than that at the first interface and the third interface, respectively. A silicon content at the second interface is higher than that at the first interface and the third interface, respectively. An atomic fraction of oxygen at the second interface is lower than that at the first interface and the third interface, respectively.

In a further aspect, embodiments of the present disclosure further provide a method for manufacturing a solar cell. The method includes: providing a substrate having a front surface and a rear surface opposite to each other; forming a passivation stack on the front surface; and forming a tunneling oxide layer and a doped conductive layer sequentially on the rear surface in a direction away from the rear surface. The passivation stack includes an oxygen-containing dielectric layer, a first passivation layer, and a second passivation layer that are sequentially disposed in a direction away from the front surface. The oxygen-containing dielectric layer includes a metal oxide material, the first passivation layer includes a silicon nitride material, and the second passivation layer includes a silicon oxynitride material. The doped conductive layer and the substrate have doping elements of a same conductivity type. The first passivation layer includes a first interface adjacent to the oxygen-containing dielectric layer and a second interface adjacent to the second passivation layer, the second passivation layer includes a third interface opposite to the second interface. A nitrogen content at the second interface is higher than that at the first interface and the third interface, respectively. A silicon content at the second interface is higher than that at the first interface and the third interface, respectively. An oxygen content at the second interface is lower than that at the first interface and the third interface, respectively.

BRIEF DESCRIPTION OF THE DRAWINGS

One or more embodiments are described as examples with reference to the corresponding figures in the accompanying drawings, and the examples do not constitute a limitation to the embodiments. Elements with the same reference numerals in the accompanying drawings represent similar elements. The figures in the accompanying drawings do not constitute a proportion limitation unless otherwise stated.

DETAILED DESCRIPTION

As discussed in the background, the light absorption efficiency of the solar cells needs to be improved.

It is found that in order to improve the light absorption efficiency of the solar cells which typically has blue appearance instead of all black appearance, the existing solutions employ a chemical etching method to prepare a black silicon textured surface, or add silicon oxide or silicon oxynitride with low refractive index on a silicon nitride mask. However, some of the finished solar cells resulting from such solutions may still appear to be blue or grey.

The present disclosure provides a solar cell, a method for manufacturing the solar cell, and a photovoltaic module. In the solar cell, a second passivation layer including a silicon oxynitride material is provided on a side of a first passivation layer away from a substrate, which enables the solar cell to have better absorption efficiency for light with short wavelength (e.g., ultraviolet light, or near ultraviolet light). Meanwhile, relationships between nitrogen content, silicon content, and oxygen content of the first passivation layer at a first interface and a second interface is determined, and relationships between nitrogen content, silicon content, and oxygen content of the second passivation layer at a second interface and a third interface is determined, so that the second passivation layer is of high refractive index to enable external light incident into the substrate at a smaller incident angle, and the first passivation layer is of higher refractive index compared with the second passivation layer to reduce internal reflection and emission of light. Therefore, the passivation layers disposed on the front surface contributes to improving the light absorption efficiency of the solar cell, thereby achieving a darker appearance of the solar cell.

The embodiments of the present disclosure will be described in detail below with reference to the accompanying drawings in order to make the objectives, technical solutions and advantages of the present disclosure clearer. However, those skilled in the art may appreciate that, in the various embodiments of the present disclosure, numerous technical details are set forth in order to provide the reader with a better understanding of the present disclosure. However, the technical solutions claimed in the present disclosure may be implemented without these technical details and various changes and modifications based on the following embodiments.

Figure 1:
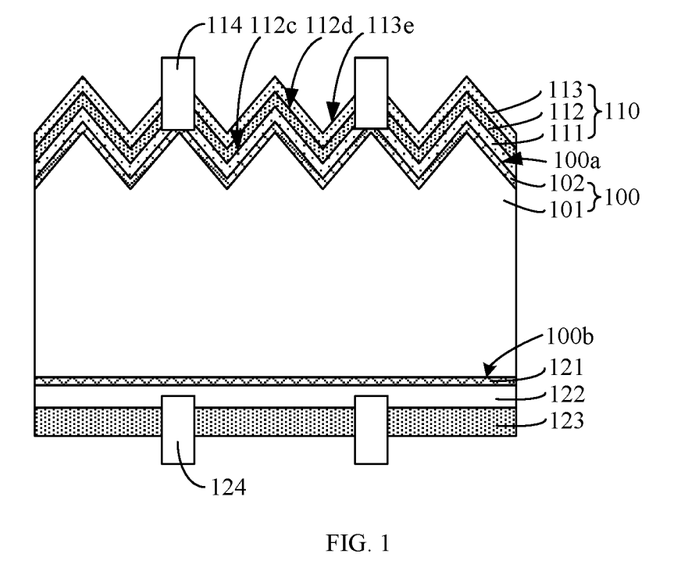
FIG. 1 is a schematic cross-sectional view of a solar cell according to an embodiment of the present disclosure.
Figure 2A:
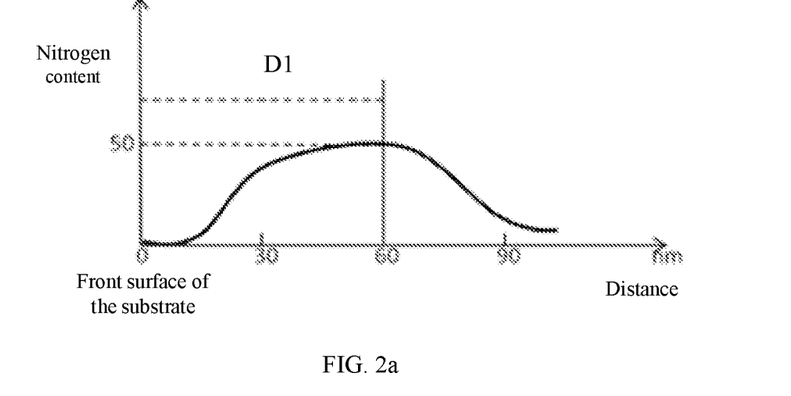
FIG. 2a is a graph showing a variation tendency of nitrogen content in a passivation stack of a solar cell according to an embodiment of the present disclosure.
Figure 2B:
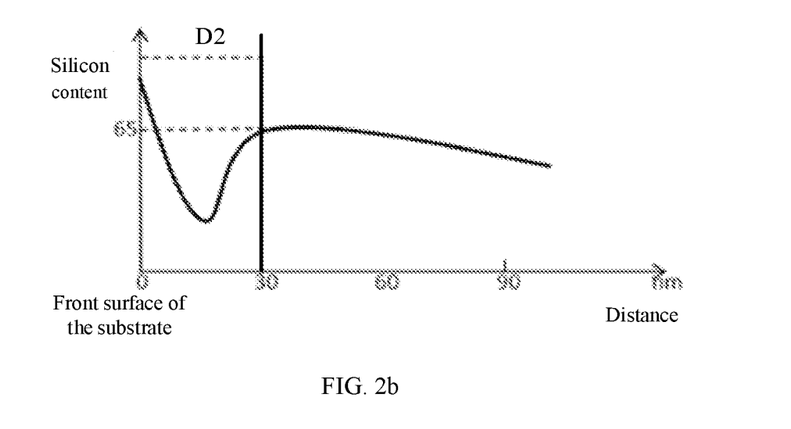
FIG. 2b is a graph showing a variation tendency of silicon content in a passivation stack of a solar cell according to an embodiment of the present disclosure.
Figure 2C:
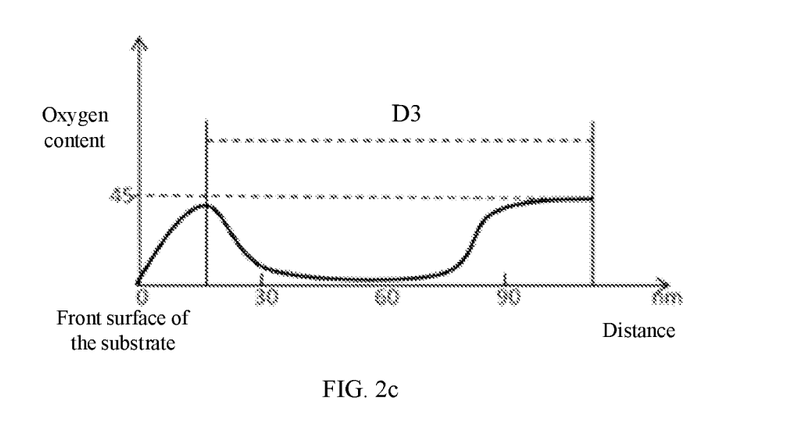
FIG. 2c is a graph showing a variation tendency of oxygen content in a passivation stack of a solar cell according to an embodiment of the present disclosure.
Figure 3:
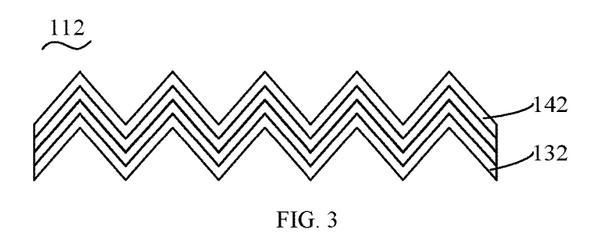
FIG. 3 is a schematic cross-sectional view of a first passivation layer of a solar cell according to an embodiment of the present disclosure.
Figure 4:
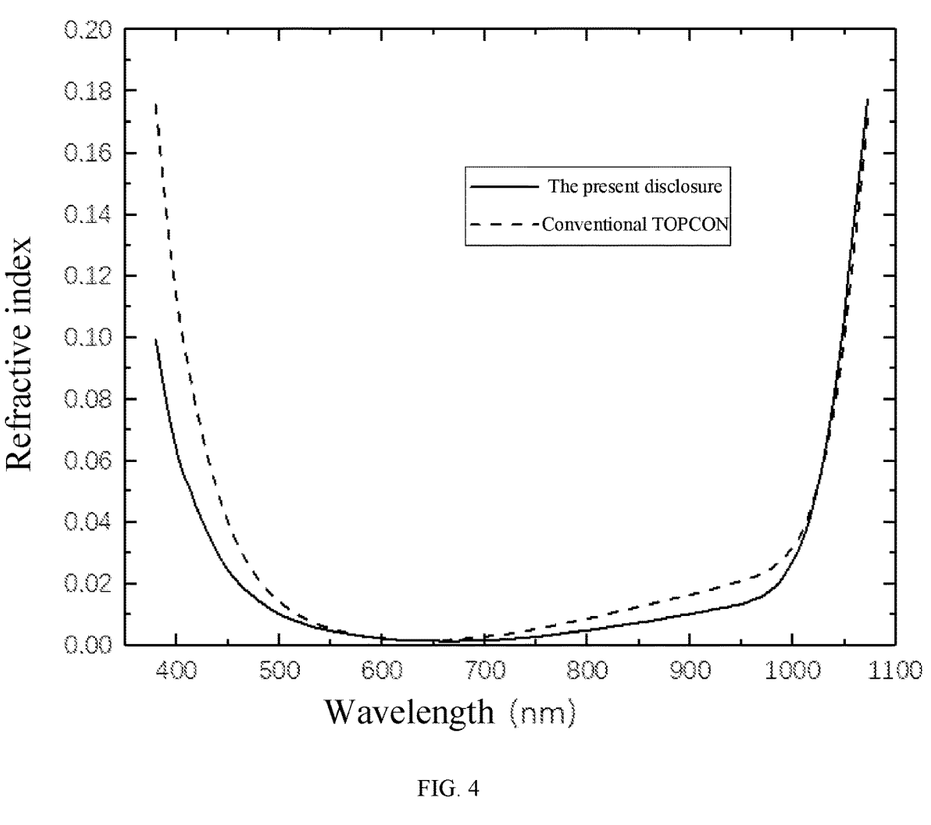
FIG. 4 is a wavelength-reflectance graph according to an embodiment of the disclosure.

FIG. 1 is a schematic cross-sectional view of a solar cell according to an embodiment of the present disclosure. FIG. 2a is a graph showing a variation tendency of nitrogen content in a passivation stack of a solar cell according to an embodiment of the present disclosure. FIG. 2b is a graph showing a variation tendency of silicon content in a passivation stack of a solar cell according to an embodiment of the present disclosure. FIG. 2c is a graph showing a variation tendency of oxygen content in a passivation stack of a solar cell according to an embodiment of the present disclosure. FIG. 3 is a schematic cross-sectional view of a first passivation layer of a solar cell according to an embodiment of the present disclosure. FIG. 4 is a wavelength-reflectance graph according to an embodiment of the disclosure.

Referring to FIG. 1, a solar cell includes a substrate 100, a passivation stack 110, a tunneling oxide layer 121 and a doped conductive layer 122. The substrate 100 has a front surface 100a and a rear surface 100b that are opposite to each other. The passivation stack 110 is disposed on the front surface 100a. The passivation stack 110 includes an oxygen-containing dielectric layer 111, a first passivation layer 112 and second passivation layer 113 that are sequentially disposed in a direction away from the front surface 100a. The passivation stack 110 includes a metal oxide material. The first passivation layer 112 includes a silicon nitride material. The second passivation layer 113 includes a silicon oxynitride material. The first passivation layer 112 has a first interface 112c adjacent to the oxygen-containing dielectric layer 111 and a second interface 112d adjacent to the second passivation layer 113, and the second passivation layer 113 has a third interface 113e opposite to the second interface 112d. A nitrogen content at the second interface 112d is higher than that at the first interface 112c and the third interface 113e, respectively. A silicon content at the second interface 112d is higher than that at the first interface 112c and the third interface 113e, respectively. An oxygen content at the second interface 112d is lower than that at the first interface 112c and the third interface 113e, respectively. The tunneling oxide layer 121 and the doped conductive layer 122 are disposed, sequentially in a direction away from the rear surface 100b, on the rear surface 100b. The doped conductive layer 122 and the substrate 100 have doping elements of a same conductivity type.

It can be understood that the nitrogen content at the first interface 112c may be denoted as a first nitrogen content, the nitrogen content at the second interface 112d may be denoted as a second nitrogen content, and the nitrogen content at the third interface 113e may be denoted as a third nitrogen content, that is, the second nitrogen content is greater than the first nitrogen content and the third nitrogen content. Similarly, the silicon content at the first interface 112c may be denoted as a first silicon content, the silicon content at the second interface 112d may be denoted as a second silicon content, and the silicon content at the third interface 113e may be denoted as a third silicon content, that is, the second silicon content is greater than the first silicon content and the third silicon content. Similarly, the oxygen content at the first interface 112c may be denoted as a first oxygen content, the oxygen content at the second interface 112d may be denoted as a second oxygen content, and the oxygen content at the third interface 113e may be denoted as a third oxygen content, that is, the second oxygen content is smaller than the first oxygen content and the third oxygen content.

The second passivation layer 113 including the silicon oxynitride material is provided on the second interface 112d of the first passivation layer 112, thereby enabling the solar cell to have better absorption efficiency for light of short wavelength. In the second passivation layer 113, the second nitrogen content is greater than the third nitrogen content, the second silicon content is greater than the third silicon content, and the second oxygen content is smaller than the third oxygen content, so that the second passivation layer 113 is of high refractive index to enable external light incident into the substrate 100 at a smaller incident angle.

In addition, in the first passivation layer 112, the second nitrogen content is greater than the first nitrogen content, the second silicon content is greater than the first silicon content, and the second oxygen content is smaller than the first oxygen content, so that the first passivation layer 112 is of higher refractive index compared with the second passivation layer 113 to reduce internal reflection and emission of light. In addition, in the process of forming the first passivation layer 112 including the silicon nitride material, hydrogen ions of an appropriate amount are introduced in the first passivation layer 112, so as to effectively saturate suspension bonds on the front surface 100a through migration, and suppress the recombination with the carriers, thereby ensuring that the carriers are effectively converged to the corresponding electrodes.

The element contents in the passivation stack 110 can be obtained by X-ray energy dispersive spectroscopy (EDS) or electron energy loss spectrum (EELS), so as to obtain the atomic fractions of elements. In some embodiments, the first passivation layer 112 is a silicon-rich layer. Compared with the conventional silicon nitride material, in the silicon nitride material in the first passivation layer 112 of the present disclosure, the atomic fraction of silicon is higher than the atomic fraction of nitrogen. Accordingly, the second passivation layer 113 may also be a silicon-rich layer, in which the atomic fraction of silicon is higher than the atomic fraction of nitrogen and the atomic fraction of oxygen.

In some embodiments, referring to FIGS. 2a to 2c, in a direction away from the front surface 100a, the nitrogen content and the silicon content in the first passivation layer 112 increase at first and then decrease, the nitrogen content and the silicon content in the second passivation layer 113 decrease, the oxygen content in the first passivation layer 112 decreases at first and then increases, and the oxygen content in the second passivation layer 113 increases.

In this way, the nitrogen content and the silicon content at the second interface 112d are higher than those at the first interface 112c and the third interface 113e, respectively, and the oxygen content at the second interface 112d is lower than that at the first interface 112c and the third interface 113e, respectively, such that the first nitrogen content, the first silicon content and the first oxygen content at the first interface 112c are smoothly transitioned to the second nitrogen content, the second silicon content and the second oxygen content at the second interface 112d, and further to the third nitrogen content, the third silicon content and the third oxygen content at the third interface 113e, thereby improving stability of the overall passivation effect of the passivation stack.

In some embodiments, as shown in FIG. 2a, in a direction away from the front surface 100a, a distance D1 from a position where the nitrogen content reaches a maximum peak value in the passivation stack 110 to the front surface 100a is greater than or equal to 30 nm. As shown in FIG. 2b, a distance D2 from a position where the silicon content reaches a maximum peak value in the passivation stack 110 to the front surface 100a is greater than 0 nm and less than or equal to 30 nm. As shown in FIG. 2c, a distance from a position where the oxygen content reaches a maximum peak value in the passivation stack 110 to a position where the oxygen content reaches a secondary peak value in the passivation stack 110 is in a range of 40 nm to 100 nm. In this way, the first passivation layer 112 is of higher refractive index than the second passivation layer 113 and thus mainly absorbs light with long wavelength, and the second passivation layer 113 mainly absorbs light with short wavelength, so that the solar cell has better absorption efficiency for both the light with long wavelength and the light with short wavelength. Meanwhile, since the second passivation layer 113 mainly absorbing the light with short wavelength is of low refractive index of, in order to the whole refractive index of the solar cell to be higher for the light with various wavelength bands, the distances from the positions where the element contents reach the maximum peak values in the passivation stack 110 to the front surface 100a or the distance from the position where the element content reaches the maximum peak value in the passivation stack 110 to the position where the element content reaches the secondary peak value in the passivation stack 110 are adjusted so that the refractive index of the first passivation layer 112 is higher than the refractive index of the second passivation layer 113 to improve the light absorption efficiency of the solar cell.

It should be appreciated that the higher the silicon content in a passivation layer, the higher the refractive index of the passivation layer, and other element contents in the passivation layer also affects the refractive index of the passivation layer, so that the refractive indexes of the layers in the passivation stack 110 is adjustable by adjusting the distances from the positions where the element contents reach the maximum peak values in the passivation stack 110 to the front surface 100a or the distance from the position where the element content reaches the maximum peak value in the passivation stack 110 to the position where the element content reaches the secondary peak value in the passivation stack 110.

It should be appreciated that the reason why the silicon content at a position which has a distance of 0 nm from the substrate 100 is higher than the position where the silicon content reaches the maximum peak value in the passivation stack 110 in FIG. 2b is that FIGS. 2a, 2b and 2c are variation tendency graphs of various elements tested with the substrate 100 being a silicon substrate material, so that it is the substrate 100, instead of the passivation stack 110, that provides mostly the silicon at the position which has a distance of 0 nm from the substrate 100.

The maximum peak value of the atomic fraction of nitrogen may be 50%, the maximum peak value of the atomic fraction of silicon may be 65%, and the maximum peak value of the atomic fraction of oxygen may be 45%.

In some embodiments, the silicon nitride included in the first passivation layer 112 may be a first $Si_mN_n$ material, in which n/m is in a range of 0.5 to 1, and the silicon oxynitride included in the second passivation layer 113 may be a $SiO_iN_j$ material, in which j/i is in a range of 0.1 to 0.6.

It can be understood that both n/m and j/i are ratios of the numbers of corresponding element atoms.

For example, the atomic fraction of each element in the passivation stack 110 can be obtained by X-ray energy dispersive spectroscopy (EDS) or electron energy loss spectrum (EELS).

It should be noted that the passivation layer can achieve a better passivation effect when the thickness and the refractive index of the passivation layer and the wavelength of the incident light satisfy: wavelength of the incident light=4×thickness×refractive index.

In the $SiO_iN_j$ material of the second passivation layer 113, j/i is in a range of 0.1 to 0.6, where i represents the number of O atoms and j represents the number of N atoms. By adjusting the ratio of the number of N atoms and the number of O atoms in the $SiO_iN_j$ material, the thickness and the refractive index of the $SiO_iN_j$ material are adjustable so that the thickness of the second passivation layer 113 matches the wavelength of the incident light and the refractive index, so that the second passivation layer 113 is of good passivation effect and high refractive index to enable external light incident into the substrate 100 at a smaller incident angle.

In the first $Si_mN_n$ material of the first passivation layer 112, n/m is in a range of 0.5 to 1, where m represents the number of Si atoms and n represents the number of N atoms. By adjusting the ratio of the number of Si atoms and the number of N atoms in the first $Si_mN_n$ material, the refractive index and thickness of the first passivation layer 112 are adjustable so that the first passivation layer 112 is of good passivation effect and higher refractive index compared with the second passivation layer 113 to reduce internal reflection and emission of light. It can be understood that the greater the number of positive charges carried in a unit volume, the stronger the electrical property, and therefore, the strength of electrical property in the first passivation layer 112 is adjustable by adjusting the thickness of the first passivation layer 112, so ae to adjust the passivation effect of the first passivation layer 112.

The solar cell shown in FIG. 1 will be described in more details below with reference to the accompanying drawings.

In some embodiments, the substrate 100 is made from silicon-based material, such as one or more of monocrystalline silicon, polysilicon, amorphous silicon, or microcrystalline silicon. In other embodiments, the substrate may be made from material, such as carbon in simple substance, organic material, or multinary-compound, and the multinary-compound may include, but are not limited to, perovskite, gallium arsenide, cadmium telluride, copper indium selenium, and the like. In some embodiments, the front surface 100a is a light receiving surface, the rear surface 100b is a surface opposite to the light receiving surface. The front surface 100a may be a pyramid-textured surface to reduce light reflection on the front surface 100a, increase light absorption and utilization, and improve conversion efficiency of the solar cell. In some embodiment, the rear surface 100b may have not a pyramid-textured surface, and may have, for example, a stacked-step structure, so as to ensure that the tunnel oxide layer 121 covering the rear surface 100b is of high density and uniformity, and to ensure that the tunnel oxide layer 121 has a good passivation effect on the rear surface 100b.

In some embodiments, the substrate 100 is an N-type semiconductor substrate. The substrate 100 includes a base region 101 and an emitter 102. The base region 101 includes N-type doping elements (e.g., phosphorus, arsenic, antimony, etc.). The emitter 102 includes P-type doping elements, and forms a PN junction with the base region 101. In other embodiments, the oxygen-containing dielectric layer 111 covers the emitter 102. The emitter 102 may be obtained by diffusion and doping of a P-type element (e.g., boron) to the surface layer of the base region 101, and a part of the doped base region 101 forms the emitter 102. The doped conductive layer 122 and the substrate 100 have doping elements of a same conductivity type, which actually means that the doped conductive layer 122 and a main body of the substrate 100 have doping elements of a same conductivity type, that is, the doped conductive layer 122 and the base region 101 have doping elements of a same conductivity type.

The metal oxide material in the oxygen-containing dielectric layer 111 may include at least one of aluminum oxide, titanium oxide, gallium oxide, or hafnium oxide. Further, the oxygen-containing dielectric layer 111 may further include at least one of silicon oxide or silicon oxynitride.

Hereafter, example is taken as follows in which the metal oxide material mainly includes a $Al_xO_y$ material, where x represents the number of Al atoms and y represents the number of O atoms.

With respect to the material property of the oxygen-containing dielectric layer 111, the negative electricity the oxygen-containing dielectric layer 111 needs to be strong enough to enhance the field passivation effect of the oxygen-containing dielectric layer 111 and realize selective transmission of carriers, meanwhile the negative electricity of the oxygen-containing dielectric layer 111 needs to be weak enough to suppress migration and permeation of external positive ions toward the substrate 100, the hardness of the oxygen-containing dielectric layer 111 needs to be low enough to reduce the stress between the oxygen-containing dielectric layer 111 and the adjacent layer, and further, the performance of the oxygen-containing dielectric layer 111 in absorption for light with short wavelength needs to be considered to improve the absorption efficiency of the solar cell for light with short wavelength. Based on the above considerations, the ratio y/x in the $Al_xO_y$ material of the oxygen-containing dielectric layer 111 may be in a range of 1.1 to 1.5, for example, 1.2, 1.3, or 1.4, optionally, y/x is greater than or equal to 1.1 and less than 1.5, and the atomic fraction of oxygen in the oxygen-containing dielectric layer 111 is controlled to be in a range of 15% to 50%.

Since the oxygen-containing dielectric layer 111 is also of field passivation effect, and the first passivation layer 112 is of positive electricity to a certain extent, it is advantageous to avoid the influence of the first passivation layer 112 on the field passivation effect of the oxygen-containing dielectric layer 111 and the photoelectric effect of the substrate 100.

With respect to the thickness of the oxygen-containing dielectric layer 111 in the direction perpendicular to the front surface 100a, it may be understood that the thicker the oxygen-containing dielectric layer 111, the stronger the field passivation effect, and meanwhile, the thicker the oxygen-containing dielectric layer 111, the greater the stress exerted on the substrate 100 by the oxygen-containing dielectric layer 111, because the aluminum oxide and the silicon are greatly different in material property. Further, based on the barrier effect of any layer itself, the thicker the oxygen-containing dielectric layer 111, the less easily the hydrogen ions in the first passivation layer 112 pass through the oxygen-containing dielectric layer 111 to saturate the suspension bonds on the front surface 100a. Based on the above considerations, the thickness of the oxygen-containing dielectric layer 111 may be in a range of 1 nm to 15 nm, for example, 3 nm, 5 nm, 7 nm, 9 nm, 10 nm, or 12 nm.

In some embodiments, the oxygen-containing dielectric layer 111 may further include a silicon oxide material in addition to the metal oxide material. In some embodiments, the silicon oxide material covers the front surface 100a, or in other words, the silicon oxide material is disposed between the substrate 100 and the metal oxide material, and the metal oxide material includes an aluminum oxide $Al_xO_y$ material. The silicon oxide material may be formed by natural oxidation or by thermal oxygen to passivate the front surface 100a. In other embodiments, on the basis that the oxygen-containing dielectric layer 111 includes a metal oxide material, the oxygen-containing dielectric layer 111 may further includes a silicon oxide material in a region near the first passivation layer 112, and the metal oxide material includes an aluminum oxide $Al_xO_y$ material. In the above-discussed embodiments, in the direction perpendicular to the front surface 100a, the thickness of the layer including the silicon oxide material may be in a range of 0.5 to 2 nm, for example, 0.8 nm, 1.1 nm, 1.4 nm or 1.7 nm, the layer should be thin enough to enable the carriers to pass through the thin film by the tunneling effect, and should be thick enough to ensure sufficient passivation effect.

In addition, the silicon oxide material is also of good anti-PID (i.e., potential induced degradation) effect. Since the package material of the photovoltaic module is difficult to completely isolate from the outside, water vapor may enter interior of the solar cell through the package material serving to seal edges of the solar cell or the backboard. In this case, the glass in the package material produces sodium ions, which move toward the surface of the solar cell under an external electric field to cause PID phenomenon, resulting in reduction of photoelectric conversion efficiency of the solar cell. The silicon oxide material is of great compactness and insulation, and thus contributes to prevent water vapor from entering the substrate 100, resulting in good anti-PID effect. In this way, even if the package material of the photovoltaic module is unlikely to be completely insulating so that the water vapor may enter the environment in which the solar cell is located through the package material serving to seal the edges of the solar cell, the layer including the silicon oxide material is able to prevent the sodium ions in the glass in the package material from moving toward the front surface 100a of the substrate 100, thereby avoiding the PID phenomenon and ensuring high photoelectric conversion efficiency of the solar cell.

Exemplary embodiments of the first passivation layer 112 will be described in detail below.

In some embodiments, referring to FIG. 1, the first passivation layer 112 is of single layer structure.

In other embodiments, referring to FIG. 3, the first passivation layer 112 includes at least two passivation sub-layers, and in a direction away from the front surface 100a, the passivation sub-layers gradually decrease in atomic fraction of silicon and gradually increase in atomic fraction of nitrogen. In this way, a refractive index of the passivation sub-layer near the front surface 100a is higher than a refractive index of the passivation sub-layer away from the front surface 100a, so that the incident light can be reflected multiple times in the first passivation layer 112, thereby improving utilization of light by the solar cell. Meanwhile, the refractive index of the first passivation layer 112 gradually reduces to be approximate to the refractive index of the second passivation layer 113, such that an overall refractive index of the passivation stack 110 is higher.

It should be noted that the first passivation layer 112 including four passivation sub-layers as shown in FIG. 3 is merely an example for illustration, and the number of passivation sub-layers included in the first passivation layer is not limited in practical applications.

The first passivation layer 112 includes a bottom passivation sub-layer 132 closest to the front surface 100a and a top passivation sub-layer 142 furthest from the front surface 100a. In the bottom passivation sub-layer 132, the atomic fraction of silicon is in a range of 60% to 70%, and the atomic fraction of nitrogen is in a range of 20% to 40%. In the top passivation sub-layer 142, the atomic fraction of silicon is in a range of 45% to 60%, and the atomic fraction of nitrogen is in a range of 30% to 50%.

In the above two embodiments, the silicon nitride included in the first passivation layer 112 may be a first $Si_mN_n$ material, in which n/m is in a range of 0.5 to 1. In this way, in the case where the ratio of the numbers of atoms in the first $Si_mN_n$ material in the first passivation layer 112 and/or the relationship of atomic fractions of elements in each passivation sub-layer in the first passivation layer 112 are determined, a range of the refractive index of the first passivation layer 112 is also substantially determined (the refractive index is also influenced by other impurity elements in the first passivation layer 112). In order to ensure that light incident through the first passivation layer 112 falls closer to the center of the substrate 100 and thus to suppress light emission, the thickness of the first passivation layer 112 in a direction perpendicular to the front surface 100a may be in a range of 30 nm to 60 nm, for example, 35 nm, 40 nm, 45 nm, 50 nm, or 55 nm. The first passivation layer 112 should be thick enough to achieve better refraction of the light in the first passivation layer 112 (otherwise, the incident light may emit through the other passivation film layers or may emit through the substrate 100 before absorbed by the substrate 100, which is disadvantageous for improving the light absorption efficiency of the solar cell). In addition, since the hydrogen ions in the first passivation layer 112 may not be sufficient to saturate the suspension bond on the front surface 100a and thus require a supplement provided by the hydrogen ions in the second passivation layer 113, the first passivation layer 112 should be thin enough to enable transmission of the hydrogen ions (otherwise, a large number of interface defects are generated on the front surface 100a, which is disadvantageous for suppressing carrier recombination of the front surface 100a and reducing contact resistance of the front surface 100a.

It will be understood that the thickness of the first passivation layer 112 may be determined in further consideration of ratio of numbers of atoms of the first passivation layer 112, such that the thickness and the ratio match to enable the first passivation layer 112 to mainly absorb light with a specific wavelength band, for example, mainly absorb light with long wavelength. Further, the thickness of the first passivation layer 112 may be determined in further consideration of a requirement on an overall thickness of the solar cell, as the overall thickness of the solar cell should be large enough to prevent the solar cell from being damaged under an external stress, should be small enough to facilitate package and save process cost.

In some embodiments, in the top passivation sub-layer 142 of the first passivation layer 112, the atomic fraction of silicon is in a range of 45% to 60% and the atomic fraction of nitrogen is in a range of 30% to 50%, and in the second passivation layer 113, the atomic fraction of silicon is in a range of 30% to 60%, the atomic fraction of oxygen is in a range of 3% to 50% and the atomic fraction of nitrogen is in a range of 5% to 50%. Thus, the atomic fraction of silicon in the second passivation layer 113 is lower than the atomic fraction of silicon in the top passivation sub-layer 142, the atomic fraction of nitrogen in the second passivation layer 113 is lower than the atomic fraction of nitrogen in the top passivation sub-layer 142, and the atomic fraction of oxygen in the second passivation layer 113 is higher than the atomic fraction of oxygen in the top passivation sub-layer 142, thereby further controlling the refractive index of the top passivation sub-layer 142 to be higher than the refractive index of the second passivation layer 113, so as to ensure that the refractive index of the first passivation layer 112 is higher than the refractive index of the second passivation layer 113, and enable the second passivation layer 113 to mainly absorb light with short wavelength.

In some embodiments, the silicon oxynitride material included in the second passivation layer 113 may be a $SiO_iN_j$ material, in which j/i is in a range of 0.1 to 0.6. In the case where the ratio of the numbers of atoms in the $SiO_iN_j$ material in the second passivation layer 113 and/or the relationship of atomic fractions of elements in the second passivation layer 113 are determined, in order to enable the solar cell to have a high absorption efficiency for light with short wavelength, and to enable the hydrogen ions in the second passivation layer 113 to serve as a sufficient supplement to the hydrogen ions in the first passivation layer 112, the thickness of the second passivation layer 113 in a direction perpendicular to the front surface 100a may be in a range of 20 nm to 40 nm, for example, 25 nm, 30 nm, or 35 nm. In some cases, existing solar cells generally of light blue appearance mainly due to the high reflectivity for the light with short wavelength (e.g., ultraviolet light band). While in the embodiments of the present disclosure, the thickness of the second passivation layer 113 is determined to be in a specific range (e.g., 20 nm to 50 nm) for mainly absorbing light with short wavelength, so that the solar cell has a dark blue or even black appearance. In this way, the photovoltaic module including the solar cell has a black appearance, is of high power generation efficiency to be applicable to various application scenarios (e.g., BIPV, short for building-integrated photovoltaic).

In some embodiments, the solar cell may have a light blue appearance when the thickness of the second passivation layer 113 is less than 20 nm, or may have a green appearance when the thickness of the second passivation layer 113 is greater than 40 nm.

It should be noted that both the first passivation layer 112 and the second passivation layer 113 may be of stack structure in which the sub-layers thereof gradually decrease in refractive index in a direction away from the front surface 100a of the substrate 100, thereby facilitating reduction of internal reflection and emission caused by an excessive difference between refractive indexes of adjacent layers. The adjacent layers herein include not only the layers in the solar cell but also the package adhesive film and the cover plate in the photovoltaic module.

In some embodiments, the refractive index of the first passivation layer 112 is greater than the refractive index of the oxygen-containing dielectric layer 111 and the refractive index of the second passivation layer 113. Since the refractive index of the first passivation layer 112 is greater than the refractive index of the second passivation layer 113, it is advantageous for reduction of reflection and emission of the light incident through the second passivation layer 113. Further, in some embodiments, the refractive index of the oxygen-containing dielectric layer 111 is greater than the refractive index of the second passivation layer 113, which further facilitates the reduction of reflection and emission of the light incident through the second passivation layer 113 and improves the absorption efficiency of the solar cell. It will be understood that, when any one of the aforementioned layers includes a plurality of sub-layers, the refractive index of the corresponding layer is an average of the refractive indexes of the sub-layers.

With respect to the second passivation layer 113, the refractive index of the second passivation layer 113 needs to be high enough to reduce the incident angle of external light, the refractive index of the second passivation layer 113 needs to be low enough to suppress internal reflection and emission and meanwhile a difference between the refractive indexes of the second passivation layer 113 and the first passivation layer 112 needs to be low, the atomic fraction of oxygen in the second passivation layer 113 should be large enough to enable mainly absorbing light with short wavelength. It is known that the refractive index of the second passivation layer 113 gradually decreases with the increase of the atomic fraction of oxygen. For enabling the solar cell to be of high absorption efficiency for light with short wavelength, the ratio j/i of the number of N atoms to the number of O atoms in the second passivation layer 113 may be in a range of 0.43 to 0.46, for example, 0.44, or 0.45, and the refractive index of the second passivation layer 113 may be in a range of 1.45 to 1.8, for example, 1.55, 1.6, 1.65, 1.7, or 1.75.

Further, the ratio n/m of the number of N atoms to the number of Si atoms in the first passivation layer 112 may be in a range of 0.56 to 0.7, for example, 0.60, 0.64, or 0.68, and the refractive index of the first passivation layer 112 may be in a range of 1.9 to 2.2, for example, 2.0, 2.05, or 2.1.

Meanwhile, the refractive index of the oxygen-containing dielectric layer 111 may be in a range of 1.6 to 1.7, for example, 1.63, 1.65, or 1.68.

Referring to FIG. 4, the solar cell provided in the embodiments of the present disclosure has a lower reflectivity than that of a conventional TOPCON cell (N-type TOPCON cell) in a short wavelength band (e.g., an ultraviolet wavelength band), and the conventional TOPCON cell typically employs an aluminum oxide or silicon nitride stack as a front passivation layer. Taking the wavelengths of 400 nm and 450 nm as examples, at the wavelength of 400 nm, the reflectivity of the conventional TOPCON cell is about 11.1% while the reflectivity of the solar cell provided in the embodiments of the present disclosure is about 6.5%, which is almost a half of the former, and at the wavelength of 450 nm, the reflectivity of the conventional TOPCON cell is about 4%, while the reflectivity of the solar cell provided in the embodiments of the present disclosure is about 2.4%, which is also almost a half of the former. Since the reflectivity for light with short wavelength band is lower, the solar cell provided in the embodiments of the present disclosure and thus the photovoltaic module including the solar cell are of dark blue or even black appearance, while the conventional solar cell and the resulting photovoltaic module are of blue appearance.

The solar cell provided in the embodiments of the present disclosure also significantly decreases in the average reflectivity for the light with a wavelength band of 380 nm to 1050 nm. Specifically, in the overall wavelength band, the reflectivity of the conventional TOPCON cell is in a range of 2.1 to 2.3%, for example, the average reflectivity of the conventional TOPCON cell is about 2.237%, while the average reflectivity of the solar cell provided in the embodiments of the present disclosure is in a range of 1.4% to 1.7%, for example, about 1.552%, which is nearly ⅔ of the former. Further, for a wavelength band of 600 nm to 800 nm, the average reflectivity of the solar cell provided in the embodiments of the present disclosure is less than one percent. When the aforementioned passivation stack (including the oxygen-containing dielectric layer 111, the first passivation layer 112, and the second passivation layer 113) is applied to the TOPCON cell, a short-circuit current of the cell is increased by 30 mA or more.

In some embodiments, the rear surface 100*b* is further provided with a passivation contact structure including at least a tunneling oxide layer 121 and a doped conductive layer 122 that are sequentially disposed in a direction away from the substrate 100. The material of the tunneling oxide layer 121 is a dielectric material, such as silicon oxide, for achieving interface passivation of the rear surface 100*b*. The material of the doped conductive layer 122 used to form field passivation may be, for example, doping silicon. The doped conductive layer 122 and the substrate 100 have doping elements of a same conductivity type. The doping silicon may be at least one of N-type doping polysilicon, N-type doping microcrystalline silicon or N-type doping amorphous silicon. The doped conductive layer 122 includes N-type doping elements therein. In some embodiment, the doped conductive layer 122 is a doped polysilicon layer. A thickness of the doped conductive layer 122 in the direction perpendicular to the rear surface 100*b* may be in a range 80 nm to 160 nm, for example, 100 nm, 120 nm or 140 nm, and a refractive index of the doped conductive layer 122 may be in a range of 3.5 to 4.5, for example, 3.75, 4, or 4.25.

In some embodiments, the doped conductive layer 122 is further provided thereon with a fourth passivation layer 123 for enhancing reflection effect of the incident light on the back of the cell. The fourth passivation layer 123 may include a plurality of sub-layers, and the plurality of sub-layers gradually decreases in refractive index in the direction from the rear surface 100*b* to the doped conductive layer 122, thereby using internal reflection to enhance the reflection effect of the incident light on the back of the cell. When the material of the fourth passivation layer 123 is silicon nitride, the silicon nitride sub-layer of higher refractive index has more hydrogen ions which may migrate to the rear surface 100*b* under a diffusion power due to concentration difference or a thermal power formed by a heat treatment process, so as to passivate interface defects between the substrate 100 and the passivation contact structure and thus suppress the carrier recombination and improve the photoelectric conversion efficiency.

Specifically, the fourth passivation layer 123 may include a bottom passivation layer, an intermediate passivation layer, and a top passivation layer that are sequentially disposed, and the bottom passivation layer covers a surface of the doped conductive layer 122. The bottom passivation layer has a refractive index in a range of 2.12 to 2.2, for example, 2.14, 2.16, or 2.18, and a thickness in the direction perpendicular to the rear surface 100*b* in a range of 10 nm to 20 nm, for example, 13 nm, 15 nm, or 18 nm. The intermediate passivation layer has a refractive index in a range of 2.10 to 2.12, for example, 2.13, 2.15 or 2.18, and a thickness in the direction perpendicular to the rear surface 100*b* in a range of 20 nm to 30 nm, for example, 23 nm, 25 nm or 28 nm. The top passivation layer has a refractive index in a range of 2.09 to 2.10, and a thickness in the direction perpendicular to the rear surface 100*b* in a range of 30 nm to 50 nm, for example, 35 nm, 40 nm or 45 nm. In general, the fourth passivation layer 123 includes a second $Si_aN_b$ material, in which a/b is in a range of 3.5 to 6.8, for example, 4.2, 4.9, 5.6 or 6.3. The fourth passivation layer 123 has an overall refractive index in a range of 2.04 to 2.2, for example, 2.08, 2.12, or 2.16, and a thickness in the direction perpendicular to the rear surface 100*b* in a range of 60 nm to 100 nm, for example, 70 nm, 80 nm, or 90 nm.

Further, the solar cell further includes a first electrode 114 electrically connected to the emitter 102 and a second electrode 124 passing through the fourth passivation layer 123 to electrically connected to the doped conductive layer 122. In some embodiments, the first electrode 114 and/or the second electrode 124 may be form by sintering and printing a conductive paste (e.g., silver paste, aluminum paste, or silver-aluminum paste).

In some embodiments of the present disclosure, the second passivation layer 113 including a silicon oxynitride material is disposed on a side of the first passivation layer 112 away from the front surface 100*a*, thereby enabling the solar cell to have better absorption effect for the light with short wavelength. Meanwhile, the relationship between nitrogen content, silicon content, and oxygen content of the first passivation layer 112 at a first interface and a second interface is determined, and the relationship between nitrogen content, silicon content, and oxygen content of the second passivation layer 113 at a second interface and a third interface is determined, so that the second passivation layer 113 is of high refractive index to enable external light incident into the substrate 100 at a smaller incident angle, and the first passivation layer 112 is of higher refractive index compared with the second passivation layer 113 to reduce internal reflection and emission of light. In addition, the first passivation layer 112 is of positive electricity to a certain extent, which contributes to avoid the influence of the first passivation layer 112 on the field passivation effect of the oxygen-containing dielectric layer 111 and the photoelectric effect of the substrate 100. By combining the above aspects, the light absorption efficiency of the solar cell is improved, so that the solar cell is of darker appearance, for example, dark blue or black.

Figure 5:
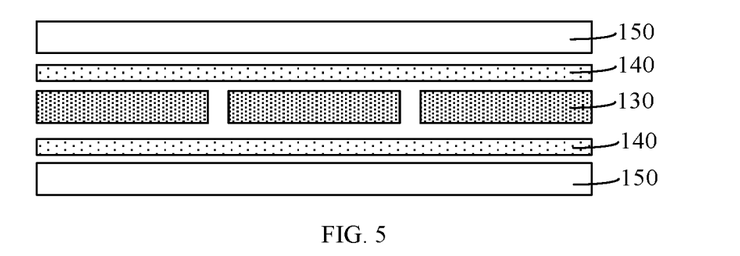
FIG. 5 is a schematic structural diagram of a photovoltaic module according to an embodiment of the present disclosure.

Embodiments of the present disclosure further provide a photovoltaic module for converting received light energy into electrical energy. FIG. 5 is a schematic structural diagram of a photovoltaic module according to an embodiment of the present disclosure.

Referring to FIG. 5, the photovoltaic module includes a cell string (not indicated), a package adhesive film 140, and a cover plate 150. The cell string is formed by connecting a plurality of solar cells 130. The solar cells 130 may be any of the foregoing solar cells (including but not limited to the solar cell of FIG. 1). Adjacent solar cells 130 are electrically connected by a conductive tape (not shown), and may be partially stacked or arranged side by side. The package adhesive film 140 may be an organic package adhesive film, such as an ethylene-vinyl acetate copolymer (EVA) adhesive film, a polyethylene octene co-elastomer (POE) adhesive film, or a polyethylene terephthalate (PET) adhesive film. The package adhesive film 140 covers a surface of the cell string for sealing. The cover plate 150 may be transparent or semi-transparent cover plate, such as a glass cover plate or a plastic cover plate, and the cover plate 150 covers a surface of the package adhesive film 140 facing away from the cell string.

In some embodiments, a light trapping structure is provided on the cover plate 150 to improve utilization of incident light. The light trapping structure may be varied depend on the cover plate 150. The photovoltaic module is of better ability in current collecting and lower carrier recombination rate, which can achieve higher photoelectric conversion efficiency. Meanwhile, the photovoltaic module has a dark blue or even black appearance in the front, which is wildly applicable.

Since the package adhesive film 140 and the cover plate 150, when disposed on a rear surface of the solar cell 130, may block or weaken the weaker light, in some embodiments, the package adhesive film 140 and the cover plate 150 are disposed only on a front surface of the solar cell 130 to avoid such blocking or weakening. Meanwhile, the photovoltaic module can be fully packaged at its sides, that is, the sides of the photovoltaic module is completely covered by the package adhesive film 140, so as to prevent the layers of the photovoltaic module from shifting during the lamination process, and prevent the external environment from affecting the performance of the solar cell through the side of the photovoltaic module, such as water vapor intrusion.

Embodiments of the present disclosure further provide a method for manufacturing a solar cell. FIG. 6 to FIG. 10 and FIG. 1 are schematic structural diagrams corresponding to various steps of the method for manufacturing a solar cell according to an embodiment of the present disclosure.

Figure 6:
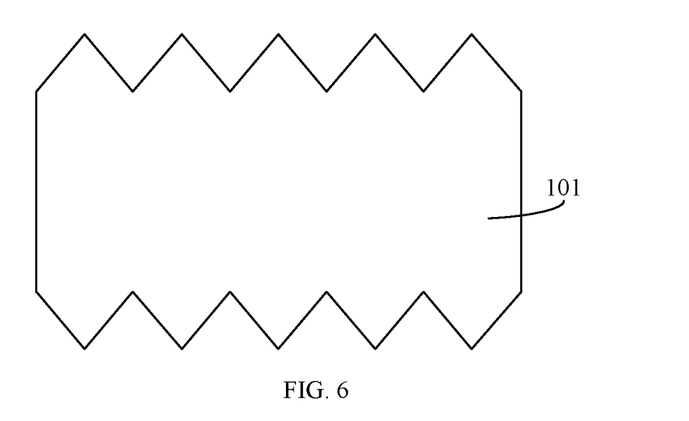
FIGS. 6 to 10 are schematic structural diagrams corresponding to various steps of a method for manufacturing a solar cell according to an embodiment of the present disclosure.
Figure 7:
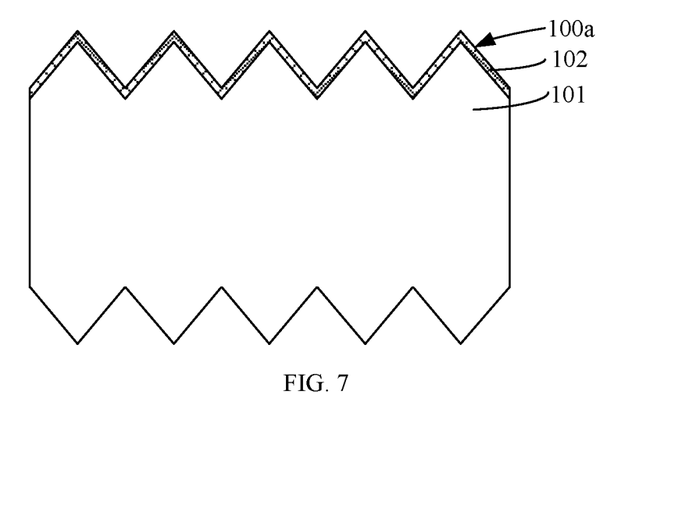
Figure 8:
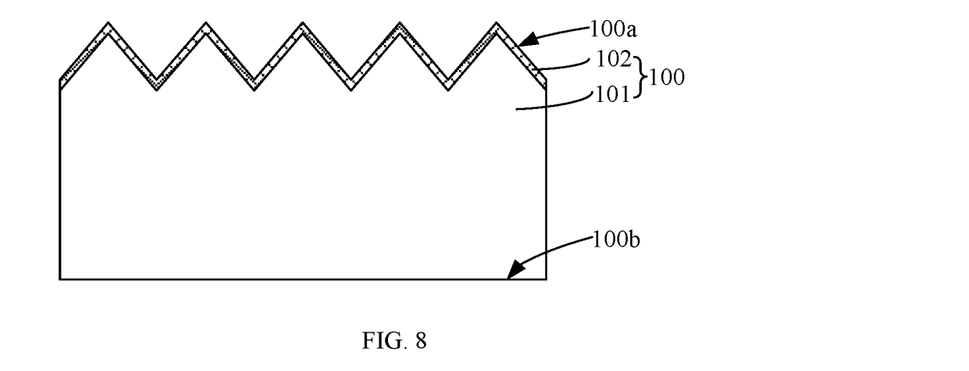

Referring to FIGS. 6 to 8, a substrate 100 is provided and has a front surface 100a and a rear surface 100b that are opposite to each other.

In some embodiments, the step of providing the substrate 100 may include the steps as follows.

Referring to FIG. 6, a base region 101 is provided and textured at both sides.

Specifically, a base region 101 is cleaned, and a pyramid-textured surface is formed thereon by wet chemical etching. The pyramid-textured surface can reduce light reflection on the surface of the base region 101, thereby improving absorption and utilization of the light on the base region 101 and improving conversion efficiency of the solar cell. In some embodiments, the base region 101 is made from monocrystalline silicon, and has a thickness in a range of 60 µm to 240 µm, in particular, 60 µm, 80 µm, 90 µm, 100 µm, 120 µm, 150 µm, 200 µm, or 240 µm, and a resistivity in a range of 0.3 ohm cm to 2 ohm cm. In addition, the base region 101 may be an N-type semiconductor or a P-type semiconductor. Example is taken in the following description in which the base region 101 is an N-type semiconductor.

It should be noted the specific operation of the texturing process is not limited herein. For example, the texturing process may be performed with, but not limited to, a wet chemical etching. When the base region 101 is made from N-type monocrystalline silicon, an alkaline solution, such as sodium hydroxide solution, may be used for the texturing process. The anisotropic corrosion of sodium hydroxide solution contributes to preparation of a pyramidal microstructure. The pyramidal microstructure may be tetrahedral, approximately tetrahedral, pentahedral, approximately pentahedral, or the like. In addition, the texturing process may be chemical etching, laser etching, mechanical process, plasma etching, or the like. The pyramidal microstructure enables the screen-printed metal paste to be better filled in the pyramidal microstructure when forming the electrode, thereby obtaining better contact of the electrodes, effectively reducing resistance of the cells connected in series and improving the filling factor. In addition, an overall reflectivity of the solar cell may be reduced by 10% by controlling the morphology of the pyramidal microstructure.

Referring to FIG. 7, a P-type emitter 102 is formed.

After texturing of both sides of the base region 101, a rear surface a of the base region 101 is subjected to a boron diffusion treatment to form a P-type emitter 102 which occupies a part of a surface layer of the base region 101 for receiving the light. The P-type emitter 102 and the N-type base region 101 constitute a substrate 100. The P-type emitter 102 has a diffusion square resistance in a range of 130Ω to 150Ω and a surface diffusion concentration in a range of E18 to E19.

It should be noted that in the boron diffusion treatment, borosilicate glass is additionally generated on a front surface (i.e., the front surface 100a), a rear surface and a side surface of the base region 101, and thus prevents the surfaces of the base region 101 from being damaged in some subsequent processes. That is, the additional borosilicate glass may serve as a mask layer for the base region 101. A boron source for the boron diffusion treatment includes liquid boron tribromide, and during the boron diffusion treatment, a phrase change occurs in the base region 101 from a microcrystalline silicon phase to a polycrystalline silicon phase.

Referring to FIG. 8, a planarization process (e.g., alkali polishing) is performed on the rear surface of the base region 101.

The rear surface is at a side of the solar cell facing away from the light. Due to the planarization process, the rear surface is planarized to form a flat surface for depositing layers thereon, i.e., the rear surface 100b. During the planarization process, the borosilicate glass on the rear surface is removed.

In some embodiments, before a polishing process, the method further includes the following steps: the borosilicate glass on the rear surface of the base region 101 is removed with a prepared mixed acid which includes a hydrofluoric acid solution having a mass fraction in a range of 0.1% to 10%, a sulfuric acid solution having a mass fraction in a range of 10% to 20% and a nitric acid solution having a mass fraction of 25% to 50%, with a pickling time in a range 10 s to 180 s and a pickling temperature in a range of 7° C. to 20° C.; and then the pickled rear surface is washed with water and dried. It should be noted that a porous structure may be formed on the rear surface 100b of the substrate 100 after pickling.

In some embodiments, the rear surface 100b may be polished with an alkali solution. Specifically, the surface b is cleaned with the alkali solution having a mass fraction in a range of 5% to 15% to remove the porous structure. The rear surface 100b is roughened by spraying microdroplets of the alkali solution on the rear surface 100b, and then pre-cleaned with hydrofluoric acid having a mass fraction in a range of 5% to 10%. The rear surface 100b is polished with a polishing solution, with a polishing temperature in a range of 70° C. to 80° C. and a polishing time of less than 260 s, and the polishing solution includes sodium hydroxide solution having a mass fraction in a range of 1% to 15%, potassium hydroxide solution having a mass fraction in a range of 1% to 15% and additive having a mass fraction in a range of 0.5% to 2.5%. Organic components are removed from the etching solution with a mixed solution which includes potassium hydroxide solution having a mass fraction in a range of 5% to 15% and hydrogen peroxide having a mass fraction in a range of 15% to 40%. Then the polished substrate 100 is washed with water and dried.

In some embodiments, since the rear surface 100b is of low concentration in boron, etching with the alkali solution can effectively improve etching efficiency. The alkali solution includes an organic base and/or an inorganic base. The inorganic base may be NaOH, KOH, $Ga(OH)_2$, or $NH_3 \cdot H_2O$. The organic base may be triethylamine, nitrophenol, pyridine, quinine, colchicine, or the like. The additive in the polishing solution may be a buffer solution including sodium sulfonate, maleic anhydride, alkyl glycoside, and the like. In some embodiments, a weight loss of the substrate 100 is less than 0.3 g after being polished, and the rear surface 100b may have a preset structure by controlling the polishing time and the polishing temperature.

In some embodiments, the structure of the rear surface 100b is different from the structure of the front surface 100a, and with the different structures, the light absorption is improved. For example, that front surface 100a may be of pyramidal structure for improving anti-reflection performance, and the rear surface 100b may be a stacked-step structure for ensuring higher density and uniformity of the tunneling oxide layer covering the rear surface 100b, and ensuring good passivation effect of the tunneling oxide layer on the rear surface 100b.

Figure 9:
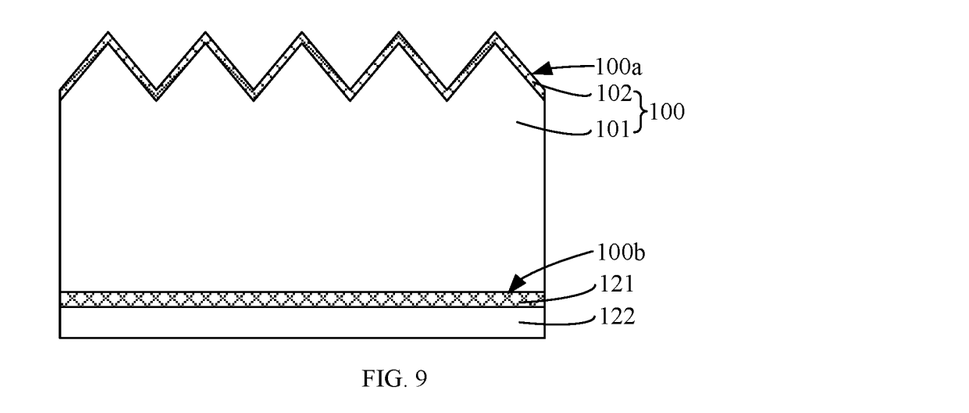

Referring to FIG. 9, a tunneling oxide layer 121 and a doped conductive layer 122 are sequentially formed on the rear surface 100b and in a direction away from the rear surface 100b. The doped conductive layer 122 and the substrate 100 have doping elements of a same conductivity type.

In some embodiments, the step of forming the tunneling oxide layer 121 and the doped conductive layer 122 includes steps as follows.

In some embodiments, the tunneling oxide layer 121 is formed by means of a deposition process. Specifically, the material of the tunneling oxide layer 121 includes silicon oxide, the deposition process includes a chemical vapor deposition process, and the thickness of the tunneling oxide layer 121 in a direction perpendicular to the rear surface 100b is in a range of 1 nm to 2 nm, for example, 1.2 nm, 1.4 nm, 1.6 nm, or 1.8 nm. In other embodiments, the tunneling oxide layer may be formed by means of an in-situ generation process. Specifically, the tunneling oxide layer may be formed in-situ by a thermal oxidation process and a nitric acid passivation process based on a silicon substrate.

In some embodiments, the tunneling oxide layer 121 is formed by deposition on the rear surface 100b by means of a variable temperature process and a chemical vapor deposition method. During deposition, a heating rate is in a range of 0.5° C./min to 3° C./min, for example, 1.0° C./min, 1.5° C./min, 2.0° C./min, or 2.5° C./min, etc., a deposition temperature is in a range of 560° C. to 620° C., for example, 570° C., 590° C., or 610° C., etc., and a deposition time is in a range of 3 min to 10 min, for example, 4 min, 6 min, or 8 min, etc.

In some embodiments, after the tunneling oxide layer 121 is formed, intrinsic polysilicon is deposited to form a polysilicon layer, and phosphorus ions are doped by ion implantation and source diffusion to form an N-type doping polysilicon layer as a doped conductive layer 122. The thickness of the doped conductive layer 122 in a direction perpendicular to the rear surface 100b may be in a range of 80 nm to 160 nm, for example, 100 nm, 120 nm, or 140 nm. In other embodiments, the doped conductive layer and the substrate have doping elements of a same conductivity type. When the substrate is an N-type semiconductor, the doped conductive layer is at least one of an N-type doping polysilicon layer, an N-type doping microcrystalline silicon layer, or an N-type doping amorphous silicon layer.

When the tunneling oxide layer 121 and the doped conductive layer 122 are formed by means of the deposition process, since the front surface 100a of the base region 101 is protected by the borosilicate glass as a mask layer on the front surface, limitation to the deposition region on the rear surface through the mask is not required during the deposition process, and the borosilicate glass on the front surface 100 and the silicon oxide and polysilicon deposited on the front surface can be removed simultaneously in a subsequent process. In this way, no additional mask is required, which is advantageous for reducing process steps, shortening process period, and lowering process cost. In other embodiments, when the interface passivation layer is formed by mean of the in-situ generation process, only polysilicon is deposited on the borosilicate glass on the front surface of the substrate.

In some embodiments, deposition of the tunneling oxide layer 121 and the polysilicon layer and doping of the polysilicon layer are performed in a low-pressure chemical vapor deposition apparatus. The specific steps are as follows: firstly, the alkali-polished substrate 100 is placed in the deposition apparatus; an oxygen source (which may be oxygen, nitrous oxide, ozone, for example) in a range of 20 L to 60 L is introduced; the chamber within the deposition apparatus is heated to a temperature in a range of 560° C. to 620° C. at a heating rate in a range of 0.5° C./min to 3° C./min for a deposition time in a range of 3 min to 10 min, so as to form the tunneling oxide layer 121; after the introduction of oxygen is completed, the temperature is controlled to be constant, and then silane gas of an appropriate amount is introduced to form the polysilicon layer; finally, the polysilicon layer is doped in situ to form the doped conductive layer 122.

Figure 10:
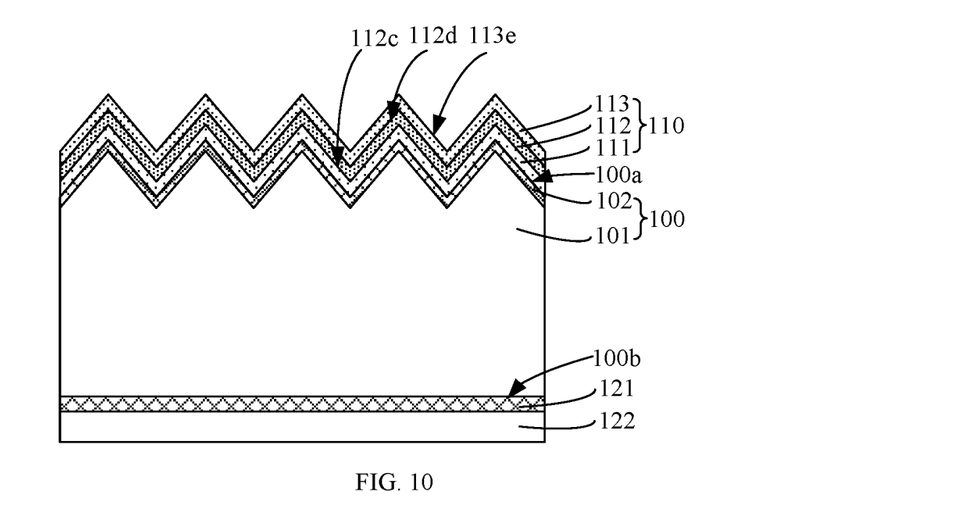

Referring to FIG. 10, a passivation stack 110 is formed on the front surface 100a, and includes an oxygen-containing dielectric layer 111, a first passivation layer 112, and a second passivation layer 113 that are sequentially disposed in a direction away from the front surface 100a. The oxygen-containing dielectric layer 111 includes a metal oxide material, the first passivation layer 112 includes a silicon nitride material, and the second passivation layer 113 includes a silicon oxynitride material. The first passivation layer 112 has a first interface 112c adjacent to the oxygen-containing dielectric layer 111 and a second interface 112d adjacent to the second passivation layer 113. The second passivation layer 113 has a third interface 113e opposite to the second interface 112d. The nitrogen content and the silicon content at the second interface 112d are higher than those at the first interface 112c and the third interface 113e, and the oxygen content at the second interface 112d is lower than that at the first interface 112c and the third interface 113e.

The oxygen-containing dielectric layer 111, the first passivation layer 112, and the second passivation layer 113 are formed in the steps as follows.

In some embodiments, the redundant borosilicate glass, silicon oxide, and polysilicon coated on the front surface 100a of the substrate 100 need to be removed prior to forming the oxygen-containing dielectric 111. In other embodiments, the redundant borosilicate glass and polysilicon coated on the front surface of the substrate need to be removed prior to forming the first passivation layer.

Further, in other embodiments, after the redundant material is removed, a thin silicon oxide layer is then generated on the front surface of the substrate. The thin silicon oxide layer is formed by natural oxidation, thermal oxidation, wet oxidation, atomic layer deposition, plasma-enhanced chemical vapor deposition, or the like. A thickness of the thin silicon oxide layer in the direction perpendicular to the substrate surface is in a range of 0 to 3 nm, for example, 1 nm, 1.5 nm, or 2 nm.

In some embodiments, the oxygen-containing dielectric layer 111, the first passivation layer 112, and the second passivation layer 113 may be formed by processes, such as chemical vapor deposition, low-pressure chemical vapor deposition, plasma-enhanced chemical vapor deposition (including direct plasma deposition and indirect plasma deposition), magnetron sputtering, or the like. For example, the first passivation layer 112 includes a first $Si_mN_n$ material, in which n/m is in a range of 0.5 to 1, and the second passivation layer 113 includes a silicon oxynitride $SiO_iN_j$ material, in which j/i is in a range of 0.1 to 0.6. Hereinafter, an atomic layer deposition process in combination with a tubular plasma-enhanced chemical vapor deposition process will be described as an example of a preparation path.

The material composition of the oxygen-containing dielectric layer 111 may be referred to the description of the foregoing embodiments, and details will not be described hereafter. Examples that the material of the oxygen-containing dielectric layer 111 is mainly a field passivation material, particularly an aluminum oxide $Al_xO_y$ material, will be described as follows.

In some embodiments, the oxygen-containing dielectric layer 111 is formed through an atomic layer deposition process with a deposition temperature in a range of 150° C. to 250° C., for example, 175° C., 200° C., or 225° C. The refractive index of the oxygen-containing dielectric layer 111 at a wavelength of 632 nm is in a range of 1.6 to 1.7, for example, 1.63, 1.65, or 1.67. The thickness of the oxygen-containing dielectric layer 111 in a direction perpendicular to the front surface 100a is in a range of 3 nm to 10 nm, for example, 5 nm, 7 nm, or 9 nm.

After the oxygen-containing dielectric layer 111 is formed, the oxygen-containing dielectric layer 111 is subjected to a high-temperature annealing treatment under a protective gas atmosphere to remove residual water molecules and organic functional groups, with an annealing temperature in a range of 450° C. to 550° C., for example, 475° C., 500° C., or 525° C., and an annealing time greater than 10 min, for example, 12 min, 14 min, or 16 min. It should be noted that the aforementioned "protective gas" may be any gas that does not participate in the reaction, such as inert gas, or nitrogen gas in some embodiments.

In some embodiments, the first passivation layer 112 is formed through a plasma enhanced chemical vapor deposition process with reactants being silane and ammonia, a flow ratio of the silane to the ammonia is in a range of 1/15 to 1/4, for example, 1/12, 1/9, or 1/6, and a pulse power per unit area is in a range of 30 mW/cm$^2$ to 40 mW/cm$^2$, for example, 33 mW/cm$^2$, 35 mW/cm$^2$, or 37 mW/cm$^2$. The flow ratio and the pulse power per unit area are determined so that, in the first passivation layer 112, the second nitrogen content is higher than the first nitrogen content, the second silicon content is higher than the first silicon content, and the second oxygen content is lower than the first oxygen content, and the atomic fractions of elements in the first $Si_mN_n$ material of the first passivation layer 112 is in a preset range to enable a preset refractive index of the first passivation layer 112. For example, the overall refractive index of the first passivation layer 112 including the first $Si_mN_n$ material at the wavelength of 632 nm is in a range of 1.9 to 2.2, for example, 2.0, 2.05, or 2.1, while the thickness of the first passivation layer 112 in the direction perpendicular to the front surface 100a is in a range of 30 nm to 60 nm, for example, 35 nm, 40 nm, 45 nm, 50 nm, or 55 nm.

In some embodiments, the second passivation layer 113 is formed through a plasma enhanced chemical vapor deposition process with reactants being silane, nitrous oxide and ammonia, a flow ratio of the silane to the nitrous oxide is not less than 1/10, for example 1/4, 1/6, or 1/8, and a pulse power per unit area is in a range of 25 mW/cm$^2$ to 40 mW/cm$^2$, for example, 28 mW/cm$^2$, 30 mW/cm$^2$, 33 mW/cm$^2$, or 36 mW/cm$^2$. The flow rate ratio and the pulse power per unit area are determined so that, in the second passivation layer 113, the second nitrogen content is higher than the third nitrogen content, the second silicon content is higher than the third silicon content, and the second oxygen content is lower than the third oxygen content, and the atomic fractions in the $SiO_iN_j$ material of the second passivation layer 113 is in a preset range to enable a preset refractive index of the second passivation layer 113. For example, the overall refractive index of the second passivation layer 113 at the wavelength of 632 nm is in a range of 1.45 to 1.8, for example, 1.5, 1.6, or 1.7, while the thickness of the second passivation layer 113 in the direction perpendicular to the front surface 100a is in a range of 20 nm to 40 nm, for example, 25 nm, 30 nm, or 35 nm.

Referring to FIG. 1, a fourth passivation layer 123 is formed on the doped conductive layer 122, and a first electrode 114 and a second electrode 124 are formed.

When the material of the fourth passivation layer 123 is silicon nitride, the fourth passivation layer 123 may be designed to include two, three or four sub-layers gradually changed in refractive index according to actual requirements. That is, the sub-layers gradually decrease in refractive index in a direction away from the substrate 100. Further, the reactant therefor may be silane and ammonia. A ratio of the number of silicon atoms to the number of nitrogen atoms in the fourth passivation layer 123 may be in a range of 3.5 to 6.8, for example, 4.2, 4.9, 5.7, or 6.3. The fourth passivation layer 123 may have a refractive index in the range of 2.04 to 2.2, for example, 2.08, 2.12, or 2.16, and a thickness in a range of 60 nm to 100 nm, for example, 70 nm, 80 nm, or 90 nm.

After the fourth passivation layer 123 is formed, the first electrode 114 and the second electrode 124 may be formed by a process, such as metallization, screen printing, and high-temperature sintering. Further, after the first electrode 114 and the second electrode 124 are formed, a light annealing treatment is also required, that is, the solar cell sheet is heated at a temperature in a range of 400° C. to 700° C. (for example, 500° C., or 600° C.) for a time in a range of 1 min to 6 min (for example, 2 min, 3 min, 4 min, or 5 min), and then treated simultaneously at a temperature in a range of 150° C. to 400° C. (for example, 200° C., 250° C., 300° C., or 350° C.) and under a light intensity in a range of 1 to 6 solar light intensities (for example, 2, 3, 4, or 5 solar light intensities) for a time in a range of 1 min to 6 min.

Those skilled in the art should appreciate that the aforementioned embodiments are specific embodiments for implementing the present disclosure. In practice, however, various changes may be made in the forms and details of the specific embodiments without departing from the spirit and scope of the present disclosure. Any person skilled in the art may make their own changes and modifications without departing from the spirit and scope of the present disclosure, so the protection scope of the present disclosure shall be subject to the scope defined by the claims.

What is claimed is:

1. A solar cell, comprising:
   a substrate having a front surface and a rear surface opposite to each other;
   a passivation stack disposed on the front surface, wherein the passivation stack includes an oxygen-containing dielectric layer, a first passivation layer, and a second passivation layer that are sequentially disposed in a direction away from the front surface, the oxygen-containing dielectric layer includes a metal oxide material, the first passivation layer includes an oxygen-containing silicon nitride material, and the second passivation layer includes a silicon oxynitride material; and
   a tunneling oxide layer and a doped conductive layer that are sequentially disposed on the rear surface in a direction away from the rear surface, wherein the doped conductive layer and the substrate have doping elements of a same conductivity type;
   wherein the first passivation layer includes a first interface adjacent to the oxygen-containing dielectric layer and a second interface adjacent to the second passivation layer, the second passivation layer includes a third interface opposite to the second interface, a nitrogen content at the second interface is higher than that at the first interface and higher than that at the third interface, a silicon content at the second interface is higher than that at the first interface and higher than that at the third interface, and an oxygen content at the second interface is lower than that at the first interface and lower than that at the third interface;
   wherein, in the direction away from the front surface, a nitrogen content and a silicon content in the first passivation layer increase at first and then decrease, a nitrogen content and a silicon content in the second passivation layer decrease, an oxygen content in the first passivation layer decreases at first and then increases, and an oxygen content in the second passivation layer increases; and
   wherein the first passivation layer has a higher refractive index than the oxygen-containing dielectric layer, and than the second passivation layer, a thickness of the oxygen-containing dielectric layer in a direction perpendicular to the front surface is in a range of 1 nm to 15 nm, a thickness of the first passivation layer in a direction perpendicular to the front surface is in a range of 30 nm to 60 nm, and a thickness of the second passivation layer in a direction perpendicular to the front surface is in a range of 20 nm to 40 nm.

2. The solar cell according to claim 1, wherein in the direction away from the front surface, a distance from a position where an oxygen content reaches a maximum peak value in the passivation stack to a position where the oxygen content reaches a secondary peak value in the passivation stack is in a range of 40 nm to 100 nm, a distance from a position where a silicon content reaches a maximum peak value in the passivation stack to the front surface is greater than 0 nm and less than or equal to 30 nm, and a distance from a position where a nitrogen content reaches a maximum peak value in the passivation stack to the front surface is greater than or equal to 30 nm.

3. The solar cell according to claim 1, wherein the metal oxide material includes at least one of aluminum oxide, gallium oxide, titanium oxide, or hafnium oxide.

4. The solar cell according to claim 1, wherein an atomic fraction of oxygen in the oxygen-containing dielectric layer is in a range of 15% to 50%.

5. A photovoltaic module, comprising:
   a cell string including a plurality of solar cells connected with each other;
   a package adhesive film configured to cover a surface of the cell string;
   a cover plate configured to cover a surface of the package adhesive film facing away from the cell string;
   wherein each of the plurality of solar cells includes:
   a substrate having a front surface and a rear surface opposite to each other;
   a passivation stack disposed on the front surface, wherein the passivation stack includes an oxygen-containing dielectric layer, a first passivation layer, and a second passivation layer that are sequentially disposed in a direction away from the front surface, the oxygen-containing dielectric layer includes a metal oxide material, the first passivation layer includes an oxygen-containing silicon nitride material, and the second passivation layer includes a silicon oxynitride material; and
   a tunneling oxide layer and a doped conductive layer that are sequentially disposed on the rear surface in a direction away from the rear surface, wherein the doped conductive layer and the substrate have doping elements of a same conductivity type;
   wherein the first passivation layer includes a first interface adjacent to the oxygen-containing dielectric layer and a second interface adjacent to the second passivation layer, the second passivation layer includes a third interface opposite to the second interface, a nitrogen content at the second interface is higher than that at the first interface and higher than that at the third interface, a silicon content at the second interface is higher than that at the first interface and higher than that at the third interface, and an oxygen content at the second interface is lower than that at the first interface and lower than that at the third interface;
   wherein in the direction away from the front surface, a nitrogen content and a silicon content in the first passivation layer increase at first and then decrease, a nitrogen content and a silicon content in the second passivation layer decrease, an oxygen content in the first passivation layer decreases at first and then increases, and an oxygen content in the second passivation layer increases; and wherein the first passivation layer has a higher refractive index than the oxygen-containing dielectric layer, and than the second passivation layer, a thickness of the oxygen-containing dielectric layer in a direction perpendicular to the front surface is in a range of 1 nm to 15 nm, a thickness of the first passivation layer in a direction perpendicular to the front surface is in a range of 30 nm to 60 nm, and a thickness of the second passivation layer in a direction perpendicular to the front surface is in a range of 20 nm to 40 nm.

6. The photovoltaic module according to claim 5, wherein in the direction away from the front surface, a distance from a position where an atomic fraction of oxygen reaches a maximum peak value in the passivation stack to a position where the atomic fraction of oxygen reaches a secondary peak value in the passivation stack is in a range of 40 nm to 100 nm, a distance from a position where a silicon content reaches a maximum peak value in the passivation stack to the front surface is greater than 0 nm and less than or equal to 30 nm, and a distance from a position where a nitrogen content reaches a maximum peak value in the passivation stack to the front surface is greater than or equal to 30 nm.

7. The photovoltaic module according to claim 5, wherein the metal oxide material includes at least one of aluminum oxide, gallium oxide, titanium oxide, or hafnium oxide.

8. The photovoltaic module according to claim 5, wherein an atomic fraction of oxygen in the oxygen-containing dielectric layer is in a range of 15% to 50%.

9. A method for manufacturing a solar cell, comprising:
providing a substrate having a front surface and a rear surface opposite to each other;
forming a passivation stack on the front surface, the passivation stack includes an oxygen-containing dielectric layer, a first passivation layer, and a second passivation layer that are sequentially disposed in a direction away from the front surface, the oxygen-containing dielectric layer includes a metal oxide material, the first passivation layer includes an oxygen-containing silicon nitride material, and the second passivation layer includes a silicon oxynitride material; and
forming a tunneling oxide layer and a doped conductive layer sequentially on the rear surface in a direction away from the rear surface, wherein the doped conductive layer and the substrate have doping elements of a same conductivity type;

wherein the first passivation layer includes a first interface adjacent to the oxygen-containing dielectric layer and a second interface adjacent to the second passivation layer, the second passivation layer includes a third interface opposite to the second interface, a nitrogen content at the second interface is higher than that at the first interface and higher than that at the third interface, a silicon content at the second interface is higher than that at the first interface and higher than that at the third interface, and an oxygen content at the second interface is lower than that at the first interface and lower than that at the third interface;

wherein in the direction away from the front surface, a nitrogen content and a silicon content in the first passivation layer increase at first and then decrease, a nitrogen content and a silicon content in the second passivation layer decrease, an oxygen content in the first passivation layer decreases at first and then increases, and an oxygen content in the second passivation layer increases; and wherein the first passivation layer has a higher refractive index than the oxygen-containing dielectric layer, and than the second passivation layer, a thickness of the oxygen-containing dielectric layer in a direction perpendicular to the front surface is in a range of 1 nm to 15 nm, a thickness of the first passivation layer in a direction perpendicular to the front surface is in a range of 30 nm to 60 nm, and a thickness of the second passivation layer in a direction perpendicular to the front surface is in a range of 20 nm to 40 nm.

10. The solar cell according to claim 1, wherein the silicon oxynitride included in the second passivation layer is a $SiO_iN_j$ material, in which j/i is in a range of 0.1 to 0.6, where i represents the number of O atoms and j represents the number of N atoms.

11. The solar cell according to claim 1, wherein the metal oxide material included in the oxygen-containing dielectric layer is a $Al_xO_y$ material, in which y/x is in a range of 1.1 to 1.5, where x represents the number of Al atoms and y represents the number of O atoms.

12. The solar cell according to claim 1, wherein the doped conductive layer is further provided thereon with a fourth passivation layer, the fourth passivation layer includes a plurality of sub-layers, and the plurality of sub-layers of the fourth passivation layer gradually decrease in refractive index in a direction from the rear surface to the doped conductive layer.

* * * * *